(12) United States Patent
Chen

(10) Patent No.: US 7,548,107 B2
(45) Date of Patent: Jun. 16, 2009

(54) VOLTAGE OUTPUT DEVICE FOR AN ELECTRONIC SYSTEM

(75) Inventor: Chih-Yuan Chen, Hsinchu (TW)

(73) Assignee: Anpec Electronics Corporation, Hsin-Chu (TW)

(*) Notice: Subject to any disclaimer, the term of this patent is extended or adjusted under 35 U.S.C. 154(b) by 3 days.

(21) Appl. No.: 11/949,050

(22) Filed: Dec. 3, 2007

(65) Prior Publication Data

US 2009/0002050 A1      Jan. 1, 2009

Related U.S. Application Data

(60) Provisional application No. 60/946,386, filed on Jun. 26, 2007.

(51) Int. Cl.
*H03L 5/00* (2006.01)
(52) U.S. Cl. ....................................... 327/333
(58) Field of Classification Search ......... 327/108–112, 327/309–314, 318, 323–325, 327–328, 333, 327/374–377, 427; 361/56, 57, 91.1, 91.5, 361/93.1, 93.9; 326/80–81
See application file for complete search history.

(56) References Cited

U.S. PATENT DOCUMENTS

| 7,233,468 | B2 * | 6/2007 | Chang et al. | 361/56 |
| 2002/0135415 | A1 * | 9/2002 | Dufort | 327/333 |
| 2008/0169858 | A1 * | 7/2008 | Chang | 327/333 |

* cited by examiner

*Primary Examiner*—Lincoln Donovan
*Assistant Examiner*—Shikha Goyal
(74) *Attorney, Agent, or Firm*—Winston Hsu

(57) ABSTRACT

The present invention discloses a voltage output device for an electronic system, for transforming an input voltage for generating an output voltage for a load, which includes a first transistor, a second transistor, a first driving unit, a second driving unit, a control unit, a diode, an inductor, a first capacitor, and a boost circuit. The boost circuit includes a level shifter, a third transistor, and a second capacitor. Whether the third transistor 502 is turned on is synchronized with the second transistor 402, so as to prevent damage caused by a huge current passing through the third transistor when the second transistor is cut off.

11 Claims, 4 Drawing Sheets

VOLTAGE OUTPUT DEVICE FOR AN ELECTRONIC SYSTEM

CROSS REFERENCE TO RELATED APPLICATIONS

This application claims the benefit of U.S. Provisional Application No. 60/946,386, filed on Jun. 26, 2007 and entitled "Bootstrap diode patent", the contents of which are incorporated herein by reference.

BACKGROUND OF THE INVENTION

1. Field of the Invention

The present invention relates to a voltage output device for an electronic system, and more particularly to a voltage output device for an electronic system for preventing components from damage by a huge current.

2. Description of the Prior Art

Analog pulse modulation, widely used in the industry, transforms sampling values of a message into features of amplitudes, periods or positions, and applies a sequence of periodical pulses as a carrier, which carries the features with each pulse sequentially. Therefore, according to different formats of the features, the prior art pulse modulation can be classified into pulse amplitude modulation, pulse width modulation, and pulse frequency modulation.

Since pulse modulation can continuously present variation of the sampling values, pulse modulation is widely used in a system having feedback outputs, such as a power supply device, a voltage converter or a driving device, etc., for providing a stable output signal. For example, please refer to FIG. 1. FIG. 1 is a schematic diagram of a voltage output device 10 according to the prior art. The voltage output device 10 is utilized for outputting a specific output voltage VOUT to a load 110 according to an input voltage VIN. The voltage output device 10 comprises a transistor 100, a transistor 102, a diode 104, an inductor 106, a capacitor 108, and a pulse control unit 112. The pulse control unit 112 is designed according to operations of pulse amplitude modulation, pulse width modulation or pulse frequency modulation. The pulse control unit 112 can control switch timings of the transistor 100 and the transistor 102 according to a specific control signal, an input voltage V1 of the inductor 106 or an output voltage of the inductor 106 (related connection wires are not shown in FIG. 1), so as to adjust the output voltage VOUT of the inductor 106 to make the output voltage VOUT to conform to some conditions, such as a specific multiple of the input voltage VIN, a low-pass-filtering result of the input voltage VIN, and so on.

Therefore, the pulse control unit 112 can transform the input voltage VIN into the specific output voltage VOUT through controlling the switch timings of the transistor 100 and the transistor 102. In some situations, such as to enhance driving capability or be applied in a high power application, the transistor 100 is implemented by an n-type metal-oxide-semiconductor transistor. Since the operation condition of an n-type metal-oxide-semiconductor transistor is a voltage drop between a gate and a source greater than a threshold voltage, a boost circuit is needed in the voltage output device 10 for providing a sufficient bias voltage for the transistor 100 and the transistor 102. Please refer to FIG. 2. FIG. 2 is a schematic diagram of a voltage output device 20 according to the prior art. The voltage output device 20 is the voltage output device 10 plus a boost circuit 200, and driving units 206 and 208. The boost circuit 200 comprises a diode 202 and a capacitor 204, and is coupled between a voltage source VCC and a first node, which is a joint of the transistor 100, the transistor 102, the diode 104 and the inductor 106. A power input terminal of the driving unit 206 is coupled between the diode 202 and the capacitor 204, and a grounding terminal of the driving unit 206 is couple to the first node. A power input terminal of the driving unit 208 is coupled to the voltage source VCC, and a grounding terminal of the driving unit 208 is couple to the ground. In addition, in FIG. 2, V2, V3, and V4 respectively present a gate voltage of the transistor 100, a gate voltage of the transistor 102, and an output voltage of the diode 202.

Please continue referring to FIG. 3. FIG. 3 is a schematic diagram of signals related to the voltage output device 20 shown in FIG. 2. In the beginning, the voltage V2 is LOW and the voltage V3 is HIGH, so the transistor 102 is turned on and the voltage V1 is in a ground level. As a result, the diode 202 keep charging to the capacitor 204 until V4=VCC−0.7V (0.7V is cut-in voltage of the diode 202.) Next, the voltage V2 changes to HIGH and the voltage V3 changes to LOW, so the transistor 100 is turned on and the transistor 102 is cut off. As a result, the voltage V1 approaches to the voltage VIN, and the voltage V4 is pulled up to VIN+VCC−0.7V. Moreover, in order to prevent the transistor 100 and the transistor 102 from conducting at the same time, which results in damage of components, there is a default time interval between changing states of the voltage V2 and the voltage V3, for simultaneously turning off the transistor 100 and the transistor 102 for a while. In such a case, when the operating status of the voltage output device 20 is between the voltage V3 changing to LOW and the voltage V2 changing to HIGH, since the load 110 keeps sinking current and the inductor 106 keeps current from changing, the inductor 106 turns on the diode 104 to sink current from the ground, and the voltage V1 changes from GND to −0.7V. At the moment, the diode 202 keeps charging to the capacitor 204 until the voltage V4=VCC−V1−0.7V=VCC−1.4V. Afterwards, the voltage V2 changes to HIGH, then the transistor 100 is turned on, and the diode 202 will sink a huge current to reverse the PN-junction. At this time, if the diode 202 cannot bear such a high power, the diode 202 will be damaged.

In a word, in the prior art, the diode in the boost circuit is required to bear a huge power, which increases production cost.

SUMMARY OF THE INVENTION

It is therefore a primary objective of the claimed invention to provide a voltage output device for an electronic system.

The present invention discloses a voltage output device for an electronic system, for transforming an input voltage for generating an output voltage for a load, which comprises a first node, a second node, a third node, a first transistor comprising a first terminal coupled to the input voltage, a second terminal, and a third terminal coupled to the first node, a second transistor comprising a first terminal coupled to the first node, a second terminal coupled to the second node, and a third terminal coupled to a ground terminal, a first driving unit comprising a power input terminal coupled to the third node, a ground terminal coupled to the first node, an input terminal, and an output terminal coupled to the second terminal of the first transistor, a second driving unit comprising a power input terminal coupled to a driving voltage, a ground terminal coupled to the ground terminal, an input terminal, and an output terminal coupled to the second node, a control unit coupled to the input terminal of the first driving unit and the input terminal of the second driving unit, for outputting a first control signal to the input terminal of the first driving unit and a second control signal to the input terminal of the second driving unit, a diode comprising an input terminal coupled to the ground terminal, and an output terminal coupled to the first node, an inductor comprising one terminal coupled to the first node and another terminal coupled to the load, a first capacitor comprising one terminal coupled to the load and another terminal coupled to the ground terminal, and a boost circuit. The boost circuit comprises These and other objectives of the present invention will no doubt become obvious to those of ordinary skill in the art after reading the following detailed description of the preferred embodiment that is illustrated in the various figures and drawings.

DETAILED DESCRIPTION

Figure 1:
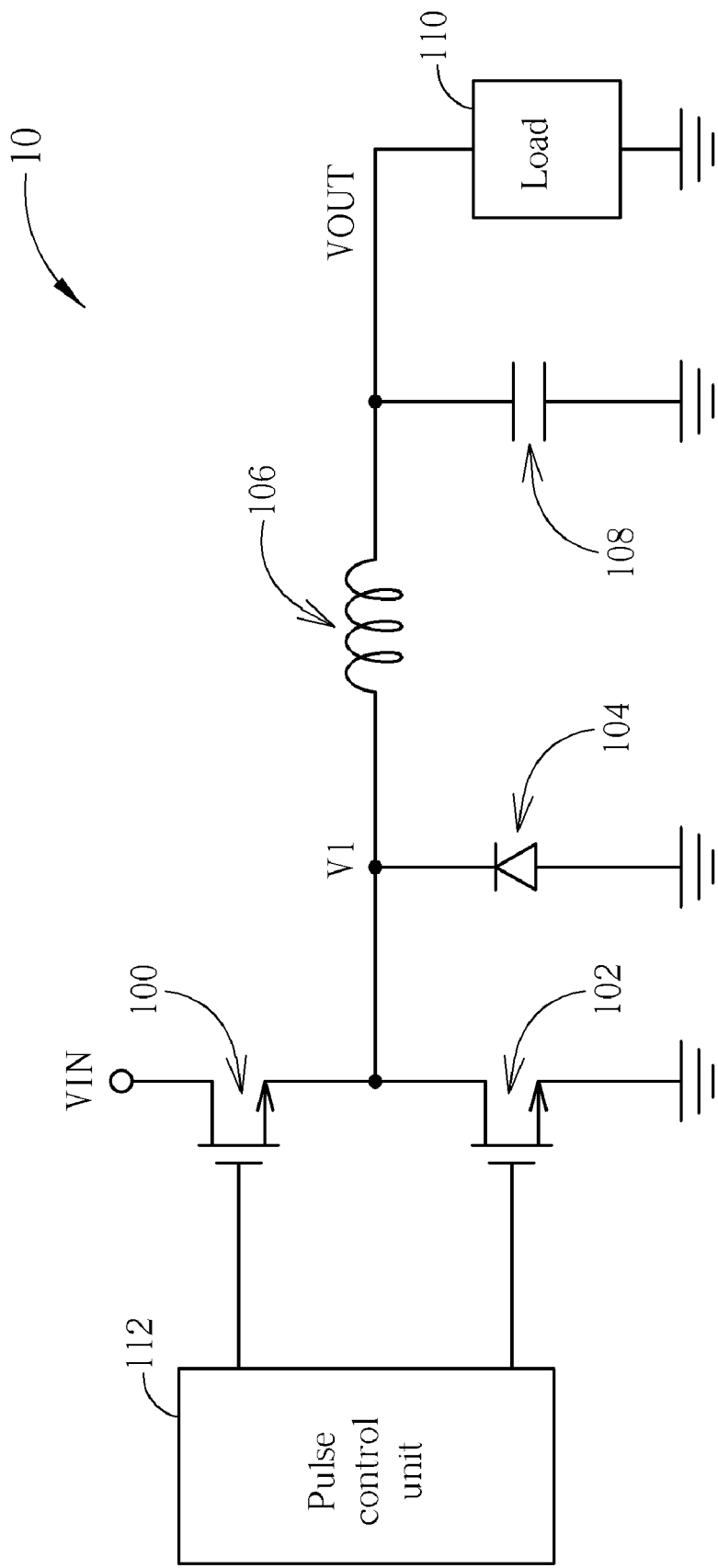
FIG. 1 is a schematic diagram of a voltage output device according to the prior art.
Figure 2:
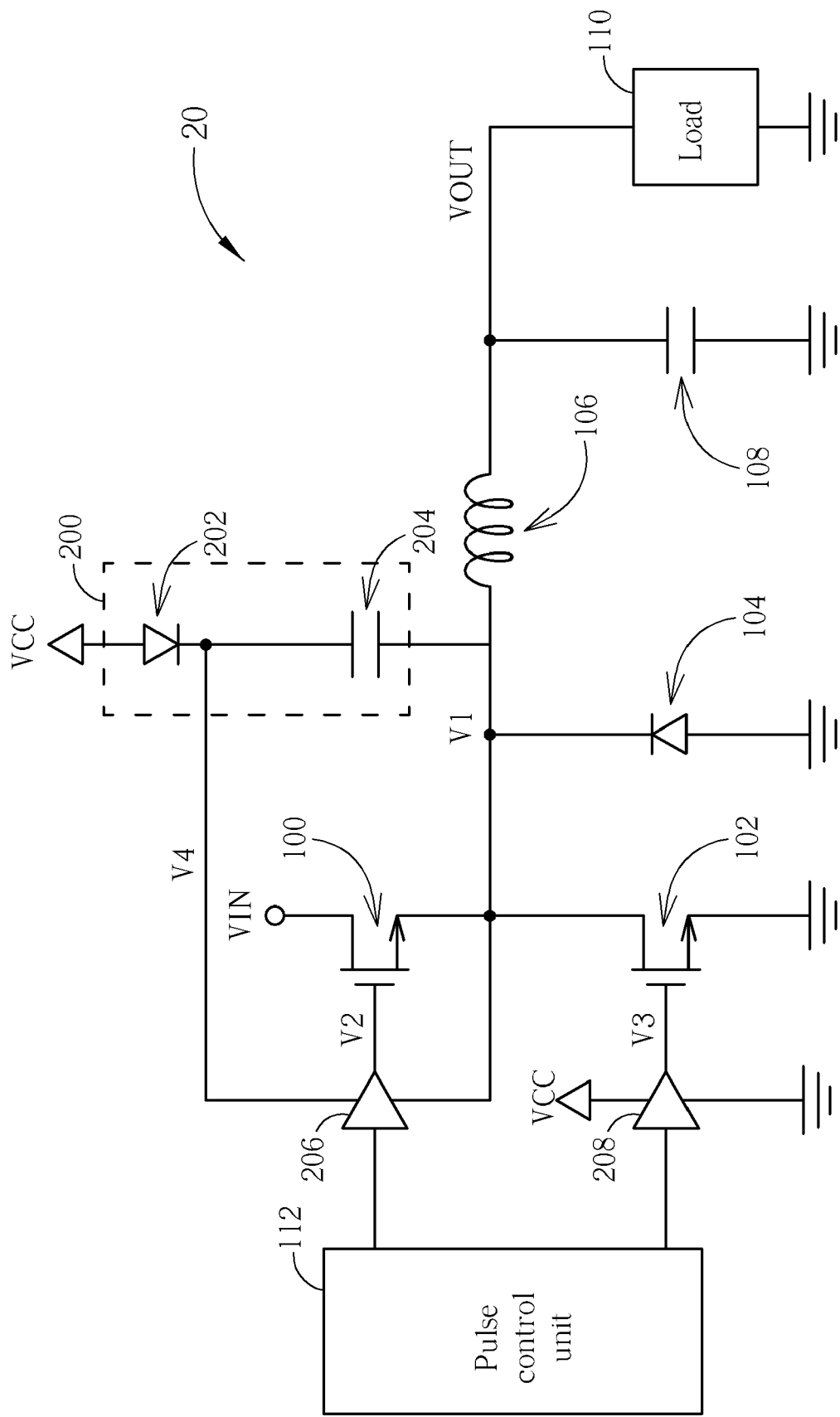
FIG. 2 is a schematic diagram of a voltage output device according to the prior art.
Figure 3:
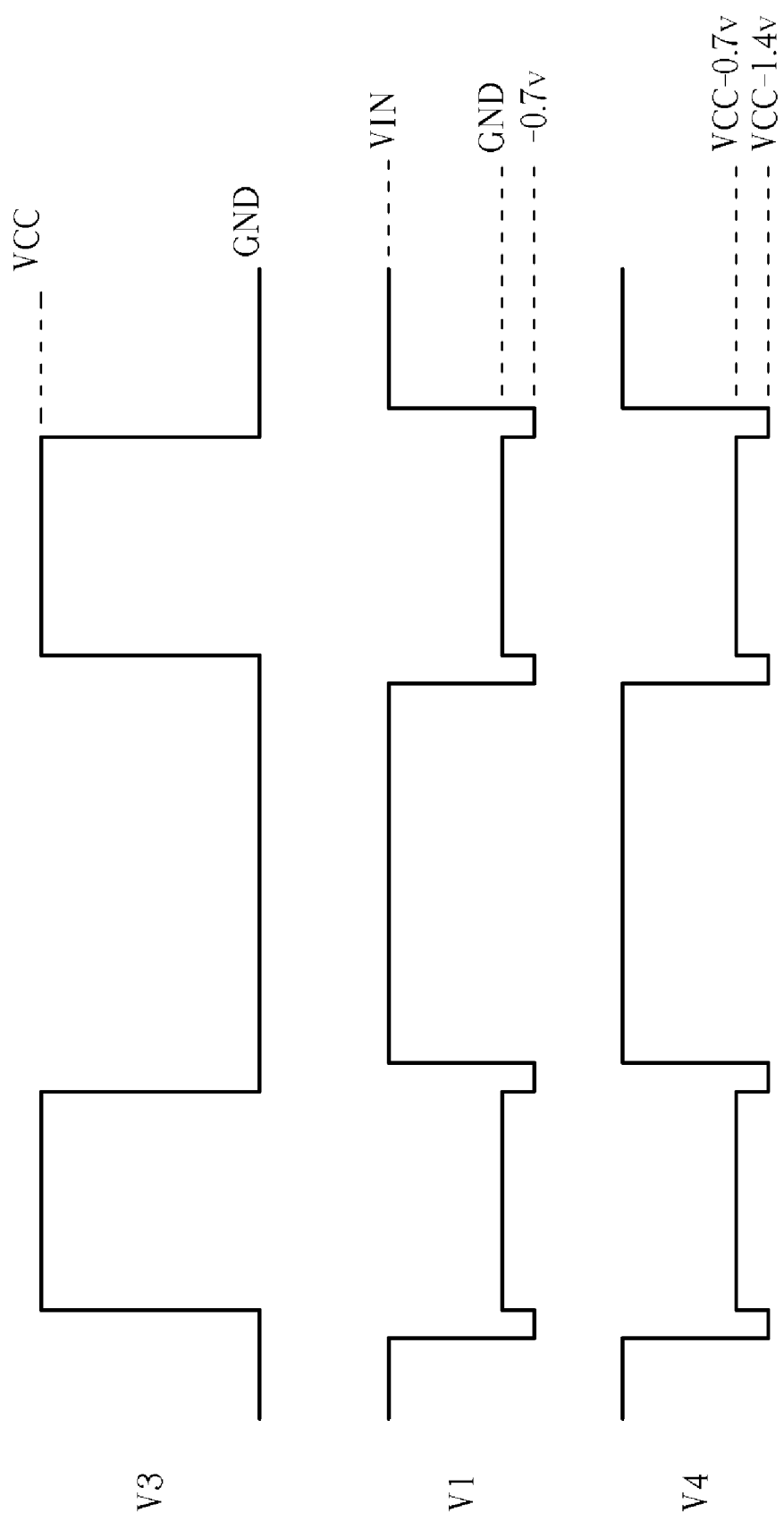
FIG. 3 is a schematic diagram of signals related to the voltage output device shown in FIG. 2.
Figure 4:
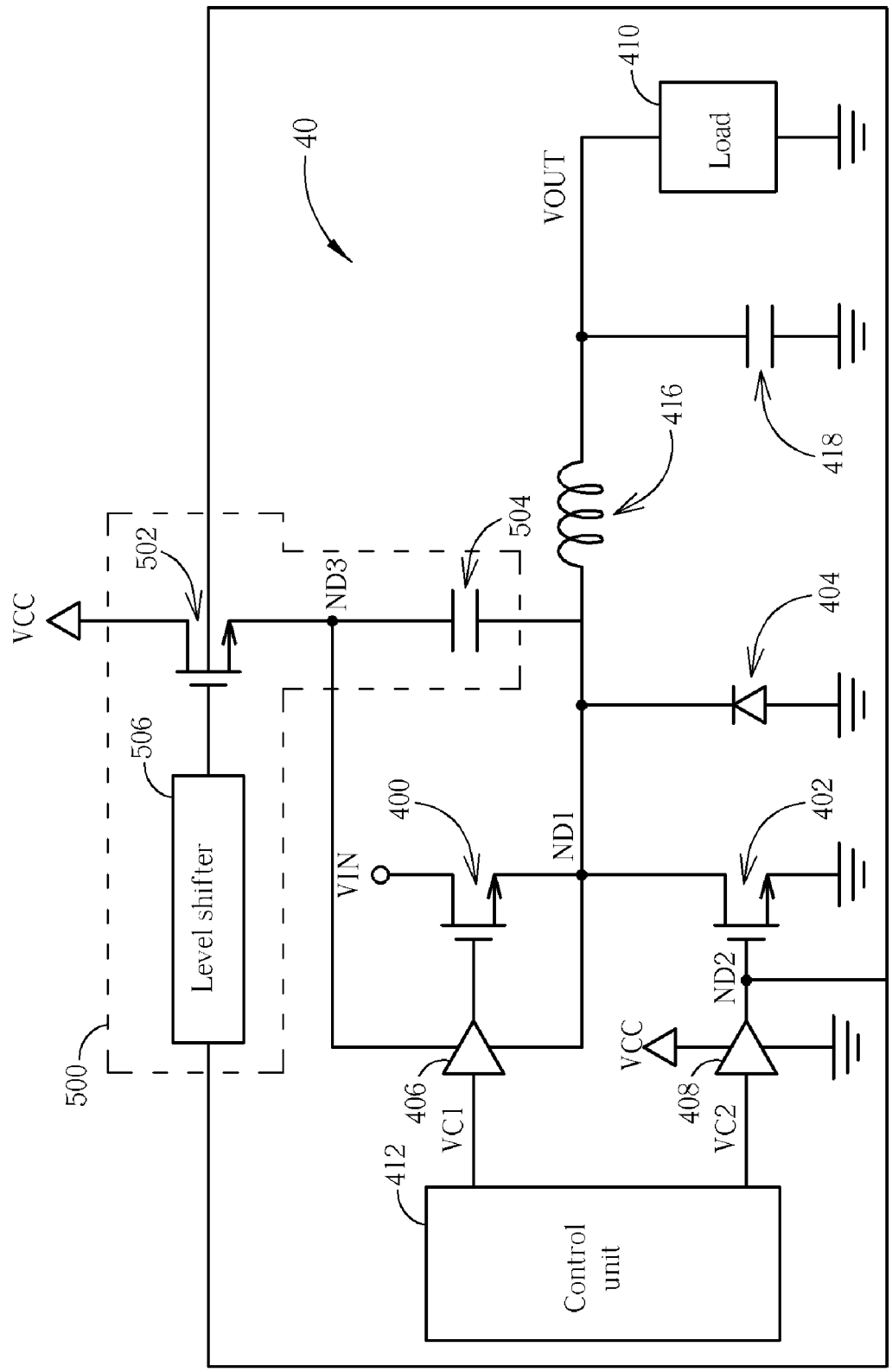
FIG. 4 is a schematic diagram of a voltage output device for an electronic system according to an embodiment of the present invention.

Please refer to FIG. 4. FIG. 4 is a schematic diagram of a voltage output device 40 for an electronic system according to an embodiment of the present invention. The voltage output device 40 is utilized for outputting a specific output voltage VOUT to a load 410 according to an input voltage VIN, and comprises a first node ND1, a second node ND2, a third node ND3, a first transistor 400, a second transistor 402, a first driving unit 406, a second driving unit 408, a control unit 412, a diode 404, an inductor 416, a first capacitor 41 8 and a boost circuit 500. The structure of the voltage output device 40 is similar to that of the voltage output device 20 shown in FIG. 2, and the identical components operate in the same way. The difference between the voltage output devices 20 and 40 is that the boost circuit 500 of the voltage output device 40 comprises a third transistor 502, a second capacitor 504, and a level shifter 506. The level shifter 506 is coupled between the second node ND2 and the third transistor 502, and utilized for shifting signals of the second node ND2, and transmitting the shifting result to the third transistor 502. The third transistor 502 is preferably an n-type metal-oxide-semiconductor transistor with a drain coupled to the voltage VCC, a gate coupled to the output terminal of the level shifter 506, a source coupled to the third node ND3, and a base coupled to the second node ND2. That is, the third transistor 502 is switched according to signals of the second node ND2. In other words, when the signal outputted from the second driving unit 408 is HIGH, the third transistor 502 conducts a connection between a voltage VCC and the third node ND3; when the signal outputted from the second driving unit 408 is LOW, the third transistor 502 cuts off the connection between a voltage VCC and the third node ND3. Meanwhile, since the base of the third transistor 502 is coupled to the second node ND2, there is no voltage drop between the source and the base of the third transistor 502, which can prevent body effect when the third transistor 502 is turned on.

In the voltage output device 40, the first transistor 400 and the second transistor 402 are preferably implemented by n-type metal-oxide-semiconductor transistors for driving capability enhancement and high power applications. In addition, the control unit 412 is preferably a pulse modulation control unit, and transforms the input voltage VIN into the specific output voltage VOUT by controlling the first transistor 400 and the second transistor 402 according to a feedback voltage, which is the voltage VOUT or the output voltage of the load 410. In order to prevent the first transistor 400 and the second transistor 402 from turning on at the same time and being damaged by a huge current, control signals VC1 and VC2, outputted from the control unit 412 to the first transistor 400 and the second transistor 402, have default time intervals for cutting off the first transistor 400 and the second transistor 402 for a while. As the voltage output device 20 shown in FIG. 2, when the operating status of the voltage output device 40 is between the second transistor 402 cut off and the first transistor turned on, the load 410 keeps sinking current and the inductor 416 keeps current from changing. Therefore, the inductor 416 turns on the first diode 404 for sinking current from the ground, and makes the voltage of the first node ND1 to change from GND to −0.7V. Meanwhile, because the gate voltage of the second transistor 402 (which is the voltage of the second node ND2) is LOW, the third transistor 502 will keep in OFF, and therefore, prevent damage by a huge current.

For this reason, in the boost circuit 500, the status of the third transistor 502 is related to the signal outputted from the second driving unit 408, which is the voltage of the second node ND2. That is, whether the third transistor 502 is turned on is synchronized with the second transistor 402. As a result, when the operating status of the voltage output device 40 is between the second transistor 402 cut off and the first transistor 400 turned on, the third transistor 502 does not sink great current to prevent damage. What is more important is the base of the third transistor 502 is coupled to the second node ND2, so that there is no voltage drop between the source and the base of the third transistor 502, which can prevent body effect when the third transistor 502 is turned on.

In conclusion, the present invention substitutes a diode of a voltage dividing circuit by the third transistor, simultaneously switches the second transistor and the third transistor, so as to prevent damage by a huge current. Meanwhile, the present invention can prevent body effect.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A voltage output device for an electronic system, for transforming an input voltage for generating an output voltage for a load, the voltage output device comprising:
   a first node;
   a second node;
   a third node;
   a first transistor comprising a first terminal coupled to the input voltage, a second terminal, and a third terminal coupled to the first node;
   a second transistor comprising a first terminal coupled to the first node, a second terminal coupled to the second node, and a third terminal coupled to a ground terminal;
   a first driving unit comprising a power input terminal coupled to the third node, a ground terminal coupled to the first node, an input terminal, and an output terminal coupled to the second terminal of the first transistor;
   a second driving unit comprising a power input terminal coupled to a driving voltage, a ground terminal coupled to the ground terminal, an input terminal, and an output terminal coupled to the second node;

- a control unit coupled to the input terminal of the first driving unit and the input terminal of the second driving unit, for outputting a first control signal to the input terminal of the first driving unit and a second control signal to the input terminal of the second driving unit;
- a diode comprising an input terminal coupled to the ground terminal, and an output terminal coupled to the first node;
- an inductor comprising one terminal coupled to the first node and another terminal coupled to the load;
- a first capacitor comprising one terminal coupled to the load and another terminal coupled to the ground terminal; and
- a boost circuit comprising:
  - a level shifter comprising an input terminal coupled to the second node, and an output terminal, for shifting levels of signals received by the input terminal and outputting the shifting result through the output terminal;
  - a third transistor comprising a first terminal coupled to the driving voltage, a second end coupled to the output terminal of the level shifter, a third end coupled to the third node, and a fourth terminal coupled to the second node, for conducting a connection between the first terminal and the third terminal according to signals of the second terminal; and
  - a second capacitor coupled to the first node and the third node.

2. The voltage output device of claim 1, wherein the first transistor is an n-type metal-oxide-semiconductor transistor, the first terminal of the first transistor is drain, the second terminal of the first transistor is gate, and the third terminal of the first transistor is source.

3. The voltage output device of claim 1, wherein the second transistor is an n-type metal-oxide-semiconductor transistor, the first terminal of the second transistor is drain, the second terminal of the second transistor is gate, and the third terminal of the second transistor is source.

4. The voltage output device of claim 1, wherein the control unit is a pulse modulation control unit.

5. The voltage output device of claim 1, wherein the control unit is utilized for outputting the first control signal and the second control signal according to a feedback voltage.

6. The voltage output device of claim 5, wherein the feedback voltage is outputted from the load.

7. The voltage output device of claim 5, wherein the feedback voltage is a voltage drop between the inductor and the first capacitor.

8. The voltage output device of claim 1, wherein at least one control signal between the first control signal and the second control signal is in a low state.

9. The voltage output device of claim 1, wherein the third transistor of the boost circuit is an n-type metal-oxide-semiconductor transistor, the first terminal of the third transistor is drain, the second terminal of the third transistor is gate, the third terminal of the third transistor is source, and the fourth terminal of the third transistor is base.

10. The voltage output device of claim 1, wherein the third transistor of the boost circuit is utilized for conducting the connection between the first terminal and the third terminal when signals received by the second terminal are in a high state.

11. The voltage output device of claim 1, wherein the third transistor of the boost circuit is utilized for cutting off the connection between the first terminal and the third terminal when signals received by the second terminal are in a low state.

* * * * *